(12) United States Patent
Lee et al.

(10) Patent No.: US 10,262,748 B1
(45) Date of Patent: Apr. 16, 2019

(54) NON-VOLATILE MEMORY AND PROGRAM METHOD THEREOF

(71) Applicant: MACRONIX International Co., Ltd., Hsinchu (TW)

(72) Inventors: Ya-Jui Lee, Taichung (TW); Atsuhiro Suzuki, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/838,109

(22) Filed: Dec. 11, 2017

(51) Int. Cl.
*G11C 16/34* (2006.01)
*G11C 16/10* (2006.01)

(52) U.S. Cl.
CPC .......... *G11C 16/3459* (2013.01); *G11C 16/10* (2013.01)

(58) Field of Classification Search
CPC ............................ G11C 16/3459; G11C 16/10
USPC ............. 365/185.03, 230.03, 185.19, 185.22
See application file for complete search history.

(56) References Cited

U.S. PATENT DOCUMENTS

| 6,192,445 | B1 * | 2/2001 | Rezvani | G11C 16/10 365/185.19 |
|---|---|---|---|---|
| 7,149,110 | B2 | 12/2006 | Tran et al. | |
| 7,233,024 | B2 | 6/2007 | Scheuerlein et al. | |
| 2009/0273977 | A1 | 11/2009 | Kim et al. | |
| 2010/0146192 | A1 * | 6/2010 | Weingarten | G11C 11/5628 711/103 |
| 2012/0008407 | A1 | 1/2012 | Park | |
| 2012/0218826 | A1 * | 8/2012 | Lee | G11C 16/10 365/185.19 |
| 2013/0182505 | A1 | 7/2013 | Liu et al. | |
| 2013/0182506 | A1 * | 7/2013 | Melik-Martirosian | G11C 16/10 365/185.18 |
| 2014/0362644 | A1 * | 12/2014 | Lue | H01L 27/092 365/185.17 |
| 2015/0070987 | A1 | 3/2015 | Kim et al. | |
| 2016/0078945 | A1 | 3/2016 | Kim et al. | |

OTHER PUBLICATIONS

"Office Action of Taiwan Counterpart Application", dated Jun. 28, 2018, p. 1-p. 5.

* cited by examiner

*Primary Examiner* — Vu A Le
(74) *Attorney, Agent, or Firm* — J.C. Patents

(57) ABSTRACT

A non-volatile memory and a program method thereof are provided. The program method of the non-volatile memory includes: setting a first incremental value, and providing a plurality of first pulses of incrementally increasing voltages in sequence according to the first incremental value for performing a programming operation on a plurality of non-volatile memory cells during a first time period; and setting a second incremental value, and providing a plurality of second pulses of incrementally increasing voltages in sequence according to the second incremental value for performing a programming operation on the non-volatile memory cells during a second time period which is after the first time period, wherein the first incremental value is smaller than the second incremental value.

17 Claims, 3 Drawing Sheets

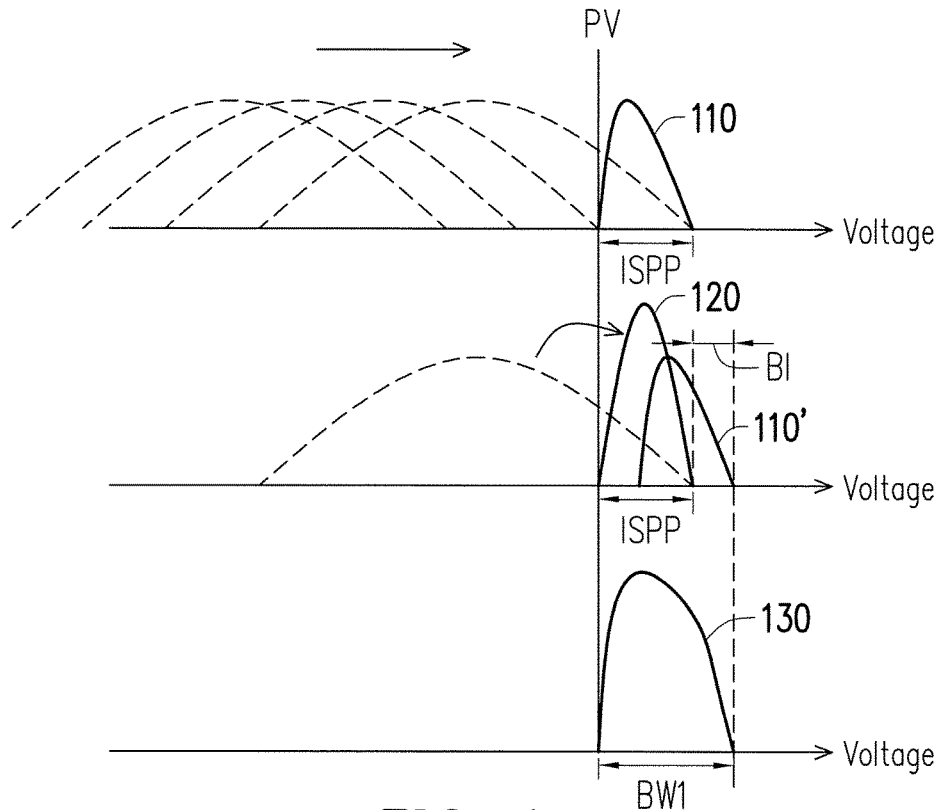

FIG. 1

| Setting a first incremental value, and providing a plurality of first pulses of incrementally increasing voltages in sequence according to the first incremental value for performing a programming operation on a plurality of non-volatile memory cells during a first time period | ~S210 |

| Setting a second incremental value, and providing a plurality of second pulses of incrementally increasing voltages in sequence according to the second incremental value for performing a programming operation on the non-volatile memory cells during a second time period which is after the first time period, wherein the first incremental value is smaller than the second incremental value | ~S220 |

FIG. 2

NON-VOLATILE MEMORY AND PROGRAM METHOD THEREOF

BACKGROUND OF THE INVENTION

Field of the Invention

The invention relates to a non-volatile memory and a program method thereof, and in particular, to a program method of a non-volatile memory capable of reducing bit line interference.

Description of Related Art

Referring to FIG. 1, FIG. 1 is a diagram illustrating a threshold voltage distribution of a programming operation of a flash memory in the prior art. In the prior art, when a programming operation is performed on memory cells of a flash memory, programming pulses that incrementally increase are generated according to a fixed incremental value (ISPP) to perform the programming operation on the memory cells through an incremental step pulse programming method. As the pulses are incrementally applied, a threshold voltage of the memory cells may move in sequence in a direction towards a reference voltage value PV, as shown by a threshold voltage distribution curve 110 for the memory cells completed with the programming operation in an initial phase. Specifically, a width of the threshold voltage distribution curve 110, if un-ideal effects (i.e. read noise, program noise . . . ) are not considered, may be equal to the incremental value ISPP. Herein, the un-ideal effects are ignored for simplified explanation.

Next, as the incremental step pulse programming operation on the memory cells continues, the threshold voltage distribution curve 110 of the threshold voltage of the memory cells completed with the programming operation in the initial phase is further moved (away from the reference voltage value PV) due to a bit line interference phenomenon BI and forms a threshold voltage distribution curve 110', and the memory cells completed with the programming operation in a later phase are as shown by a threshold voltage distribution curve 120.

When the programming operation on all of the memory cells is completed, combining the threshold voltage distribution curves 110' and 120, the threshold voltage distribution of the memory cells may be a threshold voltage distribution curve 130. It is clear here that a width BW1 of the threshold voltage distribution curve 130 is increased due to the bit line interference phenomenon BI, such that read window and/or current overdrive is reduced, and read error rate of the flash memory cells is increased.

SUMMARY OF THE INVENTION

The invention provides a non-volatile memory and a program method thereof capable of reducing an impact caused by bit line interference in a programming operation.

The program method of a non-volatile memory of the invention includes: setting a first incremental value, and providing a plurality of first pulses of incrementally increasing voltages in sequence according to the first incremental value for performing a programming operation on a plurality of non-volatile memory cells during a first time period; and setting a second incremental value, and providing a plurality of second pulses of incrementally increasing voltages in sequence according to the second incremental value for performing a programming operation on the non-volatile memory cells during a second time period which is after the first time period, wherein the first incremental value is smaller than the second incremental value.

The non-volatile memory of the invention includes a memory cell array and a controller. The memory cell array includes a plurality of non-volatile memory cells. The controller is coupled to the non-volatile memory cells and is configured to: set a first incremental value, and provide a plurality of first pulses of incrementally increasing voltages in sequence according to the first incremental value for performing a programming operation on the plurality of non-volatile memory cells during a first time period; and set a second incremental value, and provide a plurality of second pulses of incrementally increasing voltages in sequence according to the second incremental value for performing a programming operation on the non-volatile memory cells during a second time period which is after the first time period, wherein the first incremental value is smaller than the second incremental value.

In light of the above, the invention provides pulses of different incremental values for performing the programming operation on the flash memory cells during different time periods. Through the operation that is first slow (performing programming by using pulses of a relatively low incremental value) and then fast (performing programming by using pulses of a relatively high incremental value), the impact caused by bit line interference on the programming operation of the memory cells is effectively reduced, a distribution width of the threshold voltage of the programmed memory cells is reduced, and read error rate of the programmed memory cells is reduced.

To provide a further understanding of the aforementioned and other features and advantages of the disclosure, exemplary embodiments, together with the reference drawings, are described in detail below.

BRIEF DESCRIPTION OF THE DRAWINGS

FIG. 1 is a diagram illustrating a threshold voltage variation of a programming operation of a flash memory in the prior art.

FIG. 2 is a flowchart illustrating a program method of a non-volatile memory according to an embodiment of the invention.

DESCRIPTION OF THE EMBODIMENTS

Referring to FIG. 2, FIG. 2 is a flowchart illustrating a program method of a non-volatile memory according to an embodiment of the invention. In step S210, a first incremental value is set, and a plurality of first pulses of incrementally increasing voltages are provided in sequence according to the first incremental value for performing a programming operation on a plurality of memory cells of a non-volatile memory during a first time period. Next, in step S220, a second incremental value is set, and a plurality of second pulses of incrementally increasing voltages are provided in sequence according to the second incremental value for performing a programming operation on the memory cells of the non-volatile memory during a second time period which is after the first time period, wherein the first incremental value is smaller than the second incremental value.

Figure 3:
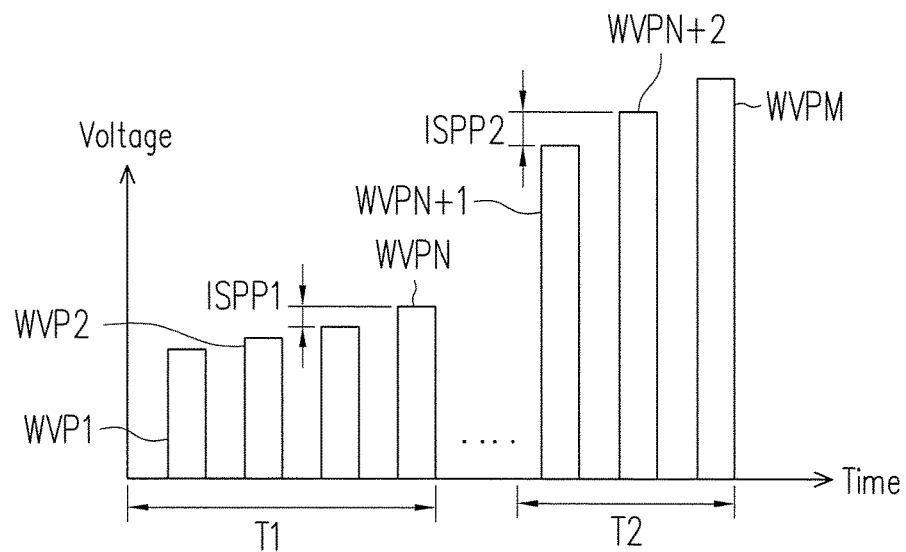
FIG. 3 is a voltage oscillogram illustrating a programming operation of an embodiment of the invention.

Referring to both FIG. 2 and FIG. 3, FIG. 3 is a voltage oscillogram illustrating the programming operation of the present embodiment of the invention. Specifically, a programming voltage applied to the non-volatile memory cells of the non-volatile memory is generated in the form of pulses. During a first time period T1, pulses of the programming voltage are generated by adding one first incremental value ISPP1 each time. For example, during the first time period T1, a voltage value of a pulse WVP2 is equal to a voltage value of a pulse WVP1 generated at a preceding time added with one first incremental value ISPP1. During a second time period T2, the pulses of the programming voltage are generated by adding one second incremental value ISPP2 each time, and the second incremental value ISPP2 is greater than the first incremental value ISPP1. For example, during the second time period T2, a voltage value of a pulse WVPN+2 is equal to a voltage value of a pulse WVPN+1 generated at a preceding time added with one second incremental value ISPP2.

Figure 4:
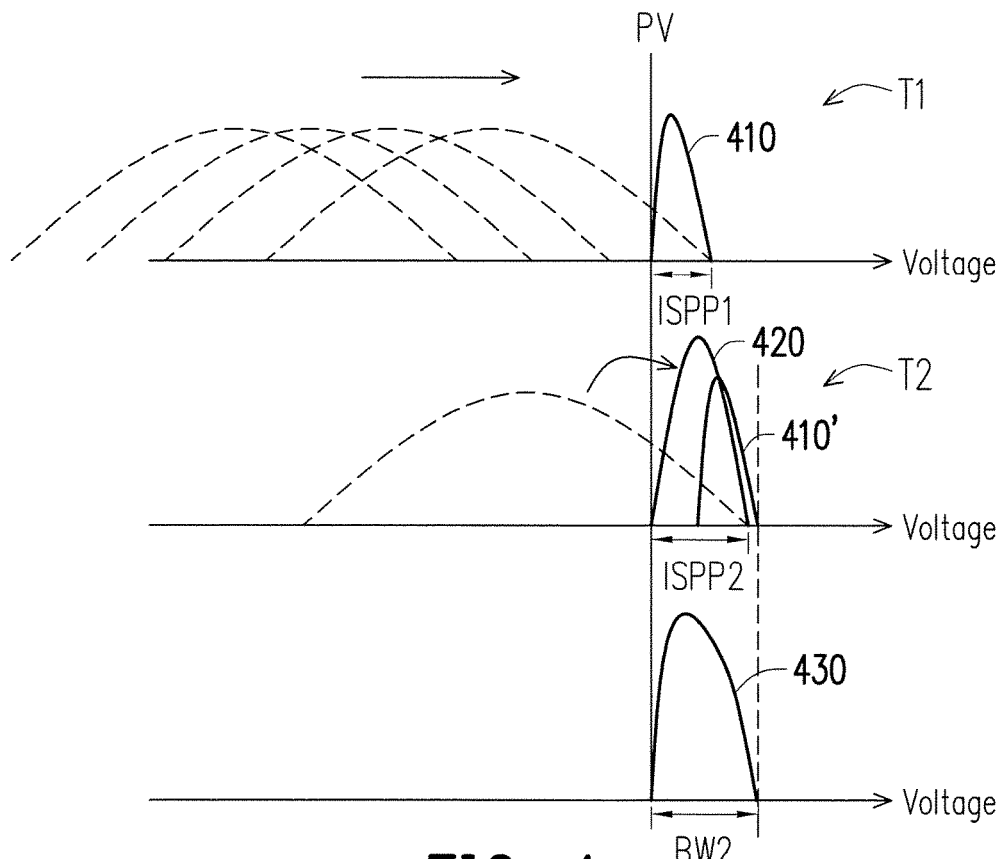
FIG. 4 is a curve graph illustrating a threshold voltage distribution of non-volatile memory cells in a programming operation of a non-volatile memory of an embodiment of the invention.

Here, referring to FIG. 4, FIG. 4 is a curve graph illustrating a threshold voltage distribution of the non-volatile memory cells in the programming operation of the non-volatile memory of the present embodiment of the invention. During the first time period T1, the non-volatile memory cells receive pulses WVP1 to WVPN of incrementally increasing voltages, the voltage value of the threshold voltage of part of the non-volatile memory cells is configured to be greater than a reference voltage value PV, and the programming operation is completed. Specifically, a threshold voltage distribution of the non-volatile memory cells completed with the programming operation is as shown by a threshold voltage distribution curve 410, wherein a width of the distribution curve 410 is substantially equal to the first incremental value ISPP1.

Next, during the second time period T2, the non-volatile memory cells further receive pulses WVPN+1 to WVPM of incrementally increasing voltages. Meanwhile, the threshold voltage distribution curve 410 may move in a direction away from the reference voltage value PV and form a threshold voltage distribution curve 410' due to BL interference. The threshold voltage of another part of the non-volatile memory cells is changed according to the programming operation of the pulses WVPN+1 to WVPM, and a threshold voltage distribution curve 420 is obtained. It shall be noted that a width of the threshold voltage distribution curve 420 is ideally approximate to the second incremental value ISPP2, and with the second incremental value ISPP2 being greater than the first incremental value ISPP1, the threshold voltage distribution curve 420 may cover a part or all of the threshold voltage distribution curve 410'. In other words, by combining the threshold voltage distribution curves 420 and 410', a distribution curve 430 of the threshold voltage of all of the non-volatile memory cells completed with the programming may be obtained, and a width BW2 of the distribution curve 430 may ideally approximate to the second incremental value ISPP2. Wherein, the width BW2 is smaller than the width BW1 illustrated in FIG. 1.

In light of the description above, it is clear that the present embodiment of the invention sets the first incremental value ISPP1 to be smaller than the incremental value ISPP in the prior art and sets the second incremental value ISPP2 to be equal to the incremental value ISPP in the prior art. Accordingly, through the program method performed in the present embodiment of the invention, the distribution curve 430 of the threshold voltage of the non-volatile memory cells with the relatively small width may be obtained, and read error rate of the non-volatile memory cells is reduced.

Referring to FIG. 3 again, it shall be noted here that in the present embodiment of the invention, the first time period T1 and the second time period T2 may occur consecutively or may occur non-consecutively. Specifically, in the embodiment where the first time period T1 and the second time period T2 do not occur consecutively, during a third time period between the first time period T1 and the second time period T2, a third incremental value smaller than the second incremental value ISPP2 and greater than the first incremental value ISPP1 may be set, and during the third time period, a plurality of third pulses of incrementally increasing voltages may be provided in sequence according to the third incremental value for performing a programming operation on the non-volatile memory cells.

Moreover, a duration of the first time period T1 can be set by different methods. Take one of the methods for example, during the first time period, after the pulses WVP1 to WVPN are applied each time for performing the programming operation, a verification operation may be performed for the non-volatile memory cells in the present embodiment of the invention, and a verification result may be obtained. Specifically, the verification operation may read the threshold voltage of the non-volatile memory cells and determine whether the programming operation on the non-volatile memory cells is completed based on a result of reading. In terms of details, it may be determined whether the threshold voltage of each of the non-volatile memory cells is greater than the reference voltage value PV, and a passing number of the non-volatile memory cells of which the threshold voltage is greater than the reference voltage value PV is calculated. Next, by comparing the passing number with a predetermined setting value, it may be determined whether the first time period T1 may be terminated. Specifically, when the passing number is greater than the predetermined setting value, the first time period T1 may be terminated.

The setting value may be obtained by multiplying a total number of the non-volatile memory cells by a predetermined ratio value. For example, the predetermined ratio value may be set at 30%. In other words, the first time period T1 may be terminated when the programming operation on half of the non-volatile memory cells is completed.

Besides, the duration of the first time period T1 may also be obtained by predetermined programming pulse numbers. For example, the timing to switch the first time period T1 to the second time period T2 can be set as programming pulse number=4, therefore, the second time period T2 will starts from programming pulse=4. Moreover, programming pulses number can also be determined by the other algorithms to compensate programming speed degradation which is caused by write/erase cycling.

It shall also be mentioned that during the second time period T2, after the pulses WVPN+1 to WVPM are applied to the non-volatile memory cells each time for performing the programming operation, a verification operation may also be performed for the non-volatile memory cells to thereby confirm whether the programming operation on the non-volatile memory cells is all completed. When the programming operation on all of the non-volatile memory cells is completed, the second time period T2 may be terminated.

In light of the description above, through the slow-to-fast incremental step pulse programming method, an impact caused by bit line interference on the threshold voltage shift of the non-volatile memory cells may be effectively reduced. Moreover, the width of the distribution curve of the threshold voltage of the non-volatile memory cells after the programming may be effectively controlled, and read error rate of the non-volatile memory cells may be reduced.

It shall also be mentioned that the non-volatile memory of the present embodiment of the invention may be a 2D NAND flash memory or a 3D NAND flash memory. Moreover, the non-volatile memory of the present embodiment of the invention may be a single level cell (SLC) flash memory, a multi-level cell (MLC) flash memory, a triple level cell (TLC) flash memory, or a quadruple level cell (QLC) flash memory.

Figure 5:
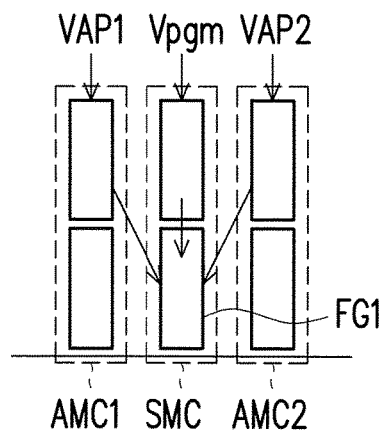
FIG. 5 is a schematic diagram illustrating a programming operation of non-volatile memory cells according to another embodiment of the invention.

Referring to FIG. 5, FIG. 5 is a schematic diagram illustrating a programming operation of non-volatile memory cells according to another embodiment of the invention. In the present embodiment, when the programming operation is performed on a selected memory cell SMC, in addition to directly providing a programming voltage Vpgm to the selected memory cell SMC, auxiliary programming pulses VAP1, VAP2 may also be provided to one or more adjacent memory cells AMC1, AMC2 adjacent to the selected memory cell SMC, as shown in FIG. 5, to adjust a voltage value actually applied to a floating gate FG1 of the selected memory cell SMC. Specifically, the present embodiment may provide only one of the auxiliary programming pulses VAP1, VAP2 to the corresponding adjacent memory cell AMC1 or AMC2, and may simultaneously provide the auxiliary programming pulses VAP1, VAP2 respectively to the adjacent memory cells AMC1 and AMC2 to adjust the voltage value actually applied to the floating gate FG1 of the selected memory cell SMC. Specifically, the auxiliary programming pulse VAP1 (VAP2) applied to the adjacent memory cell AMC1 (AMC2) may adjust the voltage value on the floating gate FG1 at the time of performing the programming operation and enhance diversity of the programming voltage through a coupling relationship between the adjacent memory cell AMC1 (AMC2) and the floating gate FG1 of the selected memory cell SMC, wherein the voltage value VW on the floating gate FG1 may be calculated according to Formula (1):

$$VW=(Vpgm)*GCR+(VAP1+VAP2)*CR+Q/C \quad (1)$$

In Formula (1), GCR is equal to a coupling ration of capacitor on the floating gate FG1 of the selected memory cell SMC, CR is equal to a coupling ratio between the selected memory cell SMC and the adjacent memory cells AMC1, AMC2. Q is charge of the floating gate FG1, and C is capacitance of the floating gate FG1.

Figure 6:
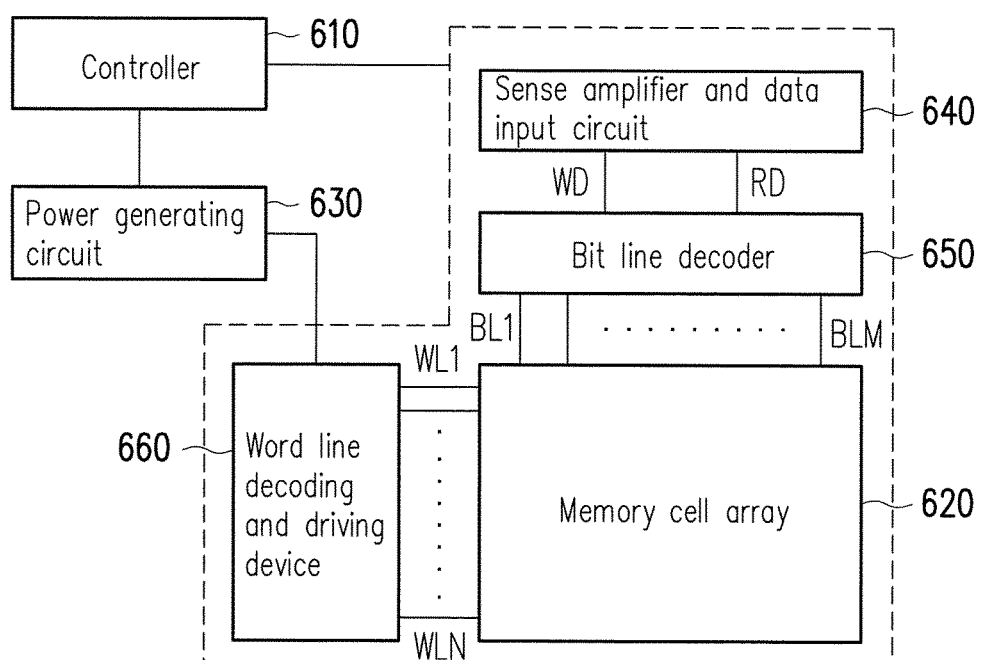
FIG. 6 is a schematic diagram illustrating a non-volatile memory according to an embodiment of the invention.

Next, referring to FIG. 6, FIG. 6 is a schematic diagram illustrating a non-volatile memory according to an embodiment of the invention. A non-volatile memory 600 includes a controller 610, a memory cell array 620, a power generator circuit 630, a sense amplifier and data input circuit 640, a bit line decoder 650, and a word line decoding and driving device 660. The memory cell array 620 includes a plurality of non-volatile memory cells. The bit line decoder 650 is coupled to the controller 610 and the memory cell array 620 and provides a plurality of bit line signals BL1 to BLM. The word line decoding and driving device 660 is coupled to the controller 610 and the memory cell array 620 and provides a plurality of word line signals WL1 to WLN. The sense amplifier and data input circuit 640 is coupled to the bit line decoder 650 and the controller 610 to receive program data WD or transmit read data RD. The power generating circuit 630 is coupled to the controller 610 and provides a voltage source for generating a first pulse and a second pulse.

The controller 610 is coupled to the memory cell array 620 and performs the steps as shown in FIG. 2 when performing a programming operation. Relevant details of implementation have been elaborated in the foregoing embodiments and exemplary examples and are thus not repeatedly described here.

In summary of the above, through the slow-to-fast incremental step pulse programming method of the invention, the issue of overly wide distribution of the threshold voltage of the non-volatile memory cells resulting from bit line interference during the programming operation may be effectively mitigated. Therefore, read error rate of the non-volatile memory cells after programming is effectively reduced, and expressiveness of the non-volatile memory is further enhanced.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A program method of a non-volatile memory, comprising:
    setting a first incremental value, and providing a plurality of first pulses of incrementally increasing voltages in sequence according to the first incremental value for performing a programming operation on a plurality of non-volatile memory cells during a first time period; and
    setting a second incremental value, and providing a plurality of second pulses of incrementally increasing voltages in sequence according to the second incremental value for performing a programming operation on the non-volatile memory cells during a second time period which is after the first time period,
    wherein the first incremental value is smaller than the second incremental value.

2. The program method of a non-volatile memory according to claim 1, further comprising:
    verifying threshold voltage values of the non-volatile memory cells during the first time period to obtain a verification result; and
    determining an end time point of the first time period according to the verification result or a predetermined programming pulse number.

3. The program method of a non-volatile memory according to claim 2, wherein the step of verifying the threshold voltage values of the non-volatile memory cells during the first time period to obtain the verification result comprises:
    verifying a passing number of the non-volatile memory cells of which the threshold voltage value is greater than a predetermined reference voltage value; and
    generating the verification result according to whether the passing number is greater than a setting value.

4. The program method of a non-volatile memory according to claim 3, wherein the setting value is equal to a product of a total number of the non-volatile memory cells and a predetermined ratio.

5. The program method of a non-volatile memory according to claim 1, further comprising:
    setting a third incremental value, and providing a plurality of third pulses of incrementally increasing voltages in sequence according to the third incremental value for performing a programming operation on the non-volatile memory cells during a third time period which is between the first time period and the second time period,
wherein the third incremental value is greater than the first incremental value, and the third incremental value is smaller than the second incremental value.

6. The program method of a non-volatile memory according to claim 1, further comprising:
generating an auxiliary programming pulse; and
providing the auxiliary programming pulse to at least one adjacent memory cell adjacent to a selected memory cell to perform an auxiliary programming operation on the selected memory cell, when the programming operation is performed on the selected memory cell according to each of the first pulses and each of the seconds pulses.

7. The program method of a non-volatile memory according to claim 1, wherein the non-volatile memory is a 2D NAND flash memory or a 3D NAND flash memory.

8. The program method of a non-volatile memory according to claim 1, wherein the non-volatile memory is a single level cell flash memory, a multi-level cell flash memory, a triple level cell flash memory, or a quadruple level cell flash memory.

9. A non-volatile memory comprising:
a memory cell array comprising a plurality of non-volatile memory cells; and
a controller coupled to the non-volatile memory cells and configured to:
set a first incremental value, and provide a plurality of first pulses of incrementally increasing voltages in sequence according to the first incremental value for performing a programming operation on the non-volatile memory cells during a first time period; and
set a second incremental value, and provide a plurality of second pulses of incrementally increasing voltages in sequence according to the second incremental value for performing a programming operation on the non-volatile memory cells during a second time period which is after the first time period,
wherein the first incremental value is smaller than the second incremental value.

10. The non-volatile memory according to claim 9, wherein the controller verifies threshold voltage values of the non-volatile memory cells during the first time period to obtain a verification result, and determines an end time point of the first time period according to the verification result or a predetermined programming pulse number.

11. The non-volatile memory according to claim 10, wherein the controller verifies a passing number of the non-volatile memory cells of which the threshold voltage value is greater than a predetermined reference voltage value, and generates the verification result according to whether the passing number is greater than a setting value.

12. The non-volatile memory according to claim 11, wherein the setting value is equal to a product of a total number of the non-volatile memory cells and a predetermined ratio.

13. The non-volatile memory according to claim 9, wherein the controller further sets a third incremental value, and provides a plurality of third pulses of incrementally increasing voltages in sequence according to the third incremental value for performing a programming operation on the non-volatile memory cells during a third time period which is between the first time period and the second time period,
wherein the third incremental value is greater than the first incremental value, and the third incremental value is smaller than the second incremental value.

14. The non-volatile memory according to claim 9, wherein the controller further generates an auxiliary programming pulse, and provides the auxiliary programming pulse to at least one adjacent memory cell adjacent to a selected memory cell to perform an auxiliary programming operation on the selected memory cell, when the programming operation is performed on the selected memory cell according to each of the first pulses and each of the seconds pulses.

15. The non-volatile memory according to claim 9, wherein the non-volatile memory is a 2D NAND flash memory or a 3D NAND flash memory.

16. The non-volatile memory according to claim 9, wherein the non-volatile memory is a single level cell flash memory, a multi-level cell flash memory, a triple level cell flash memory, or a quadruple level cell flash memory.

17. The non-volatile memory according to claim 9, further comprising:
a bit line decoder coupled to the controller and the memory cell array and providing a plurality of bit line signals;
a word line decoding and driving device coupled to the controller and the memory cell array and providing a plurality of word line signals;
a sense amplifier and data input circuit coupled to the bit line decoder and the controller to receive program data or transmit read data; and
a power generating circuit coupled to the controller and providing a voltage source for generating the first pulses and the second pulses.

* * * * *